United States Patent
Sze et al.

[11] Patent Number: 6,080,633
[45] Date of Patent: Jun. 27, 2000

[54] METHOD FOR MANUFACTURING CAPACITOR'S LOWER ELECTRODE

[75] Inventors: Jhy-Jyi Sze, Tainan; Hsiu-Wen Huang, Kaoshiung; Gary Hong, Hsinchu; Anchor Chen, Pingtung, all of Taiwan

[73] Assignee: United Semiconductor Corp., Hsinchu, Taiwan

[21] Appl. No.: 09/061,658

[22] Filed: Apr. 17, 1998

[30] Foreign Application Priority Data

Feb. 7, 1998 [TW] Taiwan ................................. 87101622

[51] Int. Cl.$^7$ ........................ H01L 21/20; H01L 21/8242
[52] U.S. Cl. ............................................ 438/398; 257/309
[58] Field of Search ................................... 438/255, 256, 438/397, 398; 257/301, 303, 306, 309

[56] References Cited

U.S. PATENT DOCUMENTS

| | | | |
|---|---|---|---|
| 5,278,091 | 1/1994 | Fazan et al. | 438/398 |
| 5,622,889 | 4/1997 | Yoo et al. | 438/397 |
| 5,792,689 | 8/1998 | Yang et al. | 438/253 |
| 5,858,837 | 1/1999 | Sakoh et al. | 438/255 |
| 5,933,728 | 8/1999 | Sze | 438/255 |
| 6,004,846 | 12/1999 | Iee | 438/255 |

FOREIGN PATENT DOCUMENTS 2 308 740   7/1997   United Kingdom .

*Primary Examiner*—Olik Chaudhuri
*Assistant Examiner*—William David Coleman
*Attorney, Agent, or Firm*—Thomas, Kayden, Horstemeyer & Risley

[57] ABSTRACT

A method for forming the lower electrode of a capacitor comprising the steps of forming a first dielectric layer, a silicon nitride layer and an oxide layer over a substrate. Then, a first conducting layer is formed in an opening making electrical contact with a specified region of the substrate. Next, a first hemispherical grained silicon layer and a second dielectric layer are formed over the first conductive layer. Thereafter, the second dielectric layer, the first hemispherical grained silicon layer and the first conductive layer are patterned. Subsequently, a second conductive layer and a second hemispherical grained silicon layer are formed over the whole substrate structure. Next, portions of the second hemispherical grained silicon layer and the second conductive layer lying above the oxide layer and the second dielectric layer are removed. Finally, the second dielectric layer is removed to expose the first hemispherical grained silicon layer. This invention avoids the damaging effects to the first hemispherical grained silicon layer caused by the etching back operation, and prevents the formation of micro-bridges that may erroneously link up adjacent lower electrodes.

15 Claims, 4 Drawing Sheets

METHOD FOR MANUFACTURING CAPACITOR'S LOWER ELECTRODE

CROSS-REFERENCE TO RELATED APPLICATION

This application claims the priority benefit of Taiwan application serial no. 87101622, filed Feb. 7, 1998, the full disclosure of which is incorporated herein by reference.

BACKGROUND OF THE INVENTION

1. Field of Invention

The present invention relates to a method for manufacturing semiconductor device. More particularly, the present invention relates to a method for manufacturing the lower electrode of a capacitor.

2. Description of Related Art

Dynamic random access memory (DRAM) is a device for storing digital data. Since DRAMs make use of a capacitor to store data, the capacitance of a DRAM capacitor should be sufficiently large so that data retention time can be longer. With the advent of ultra-large semiconductor integration (ULSI), the size of each memory cell in a DRAM is reduced. Consequently, the electrode surface area of a capacitor must somehow be increased in order to compensate for the drop in capacitance. For example, a hemispherical grained silicon (HSG) layer is deposited over an electrode plate of the capacitor to increase its surface area.

FIGS. 1A through 1F are cross-sectional views showing the progression of manufacturing steps in producing the lower electrode of a capacitor according to a conventional method. First, as shown in FIG. 1A, a semiconductor substrate 10 having field oxide layers 12 defining a device region is provided. Details of the devices within the device region are not shown in the figure. A dielectric layer 14 is formed over the substrate 10, and contact windows 16 are formed in the dielectric layer 14 exposing one of the source/drain region (not shown in the figure) of a transistor within the device region.

Next, as shown in FIG. 1B, a conductive layer 18 is deposited over the dielectric layer 14 and into the contact openings 16 making electrical connection with the source/drain region. The conductive layer 18 can be, for example, an ion-doped polysilicon layer deposited by a low-pressure vapor deposition process. Then, a cap dielectric layer 22 is deposited over the conductive layer 18 using, for example, a chemical vapor deposition method. The cap dielectric layer 22 can be made from, for example, borophosphosilicate glass (BPSG). Thereafter, photolithographic and etching processes are used to pattern the cap dielectric layer 22 and the conductive layer 18, finally forming the structure as shown in FIG. 1B.

Next, as shown in FIG. 1C, a layer of ion-doped polysilicon is deposited over the whole substrate structure using, for example, a low-pressure chemical vapor deposition (LPCVD) method. Thereafter, the polysilicon layer is etched back to form spacers over the sidewalls of the cap dielectric layer 22 and the conductive layer 18 using, for example, an anisotropic etching method.

Next, as shown in FIG. 1D, the cap dielectric layer 22 is removed to expose the conductive layer 18. The cap dielectric layer 22 is removed, for example, by a reactive ion etching (RIE) method employing gaseous hydrogen fluoride or hydrofluoric acid solution.

Next, as shown in FIG. 1E, a hemispherical grained silicon layer 26 is formed over the whole substrate structure including the conductive layer 18, the dielectric layer 14 and the spacers 24. The hemispherical grained silicon layer 26 can be deposited, for example, by a low pressure vapor deposition (LPCVD) method using a silane $SiH_4$ or $Si_2H_6$ as the source of reactive gas. The deposition of hemispherical grained silicon is preferably conducted at a temperature between the growth of amorphous silicon and the growth of polysilicon.

Next, as shown in FIG. 1F, the hemispherical grained silicon layer 26 above the dielectric layer 14 is removed using, for example, an anisotropic etching back operation. The conductive layer 18, the spacers 24 and the residual hemispherical grained silicon layer 26 together constitute the lower electrode of a capacitor. The reason for removing the portion of hemispherical grained polysilicon layer above the dielectric layer 14 is for preventing any electrical connection between two adjacent conductive layers 18. In other words, avoiding any damage to the semiconductor device caused by the electrical connection between any two lower electrodes of adjacent capacitors.

However, the whole hemispherical grained silicon layer 26 is exposed to the etchants when portions of the hemispherical layer 26 that lies over the dielectric layer 14 is removed in an etching back operation. Consequently, the remaining hemispherical grained silicon layer 26 will be damaged as well. Damage to that portion of the hemispherical grained silicon layer 26 that lies above the conductive layer 18 is especially serious, and may easily lead to leakage current from the subsequently deposited dielectric layer. Therefore, the etching operation must be carefully controlled in order to avoid too much damage to the hemispherical grained silicon layer 26.

Furthermore, if the back etching operation is not properly controlled, there may be residual electrical connection called micro-bridges linking up adjacent lower electrodes. These micro-bridges may cause short-circuiting path damaging both adjacent capacitors.

In light of the foregoing, there is a need for improving the method of forming the hemispherical grained silicon layer.

SUMMARY OF THE INVENTION

Accordingly, the present invention is to provide a method for manufacturing the lower electrode of a capacitor such that the over-etching of hemispherical grained silicon layer and the formation of micro-bridges in a conventional fabricating method are prevented.

To achieve these and other advantages and in accordance with the purpose of the invention, as embodied and broadly described herein, the invention provides a method for manufacturing the lower electrode of a capacitor. The method comprises the steps of providing a semiconductor substrate, and then forming a first dielectric layer over the substrate. Next, a silicon nitride layer is formed over the first dielectric layer, and then, an oxide layer is formed over the silicon nitride layer. Thereafter, the oxide layer, the silicon nitride layer and the first dielectric layer are patterned to form a contact opening exposing a specified region of the substrate. In the subsequent step, a first conductive layer is deposited over the oxide layer and into the contact opening making electrical connection with the specified region of the substrate. Next, a first hemispherical grained silicon layer is formed over the first conductive layer, and then a second dielectric layer is formed over the first hemispherical grained silicon layer. Then, the second dielectric layer, the first hemispherical grained silicon layer and the first conductive layer are patterned to expose a portion of the oxide layer. After that, a second conductive layer is formed over the second dielectric layer, the first conductive layer and the oxide layer.

Thereafter, a second hemispherical grain silicon layer is formed over the second conductive layer. Portions of the second conductive layer and the second hemispherical grained layer that lies above the oxide layer and the second dielectric layer are then removed to expose portions of the oxide layer and the second dielectric layer. However, portions of the second conductive layer and the second hemispherical grained silicon layer on the sidewalls of the second dielectric layer and the first conductive layer are retained. Finally, the second dielectric layer and the oxide layer are removed and the lower electrode of a capacitor is formed. The lower electrode is made up of the second hemispherical grained silicon layer, the second conductive layer, the first hemispherical grained silicon layer and the first conductive layer.

The invention uses the second dielectric layer as a mask for protecting the first hemispherical grained silicon layer against etching back operation so that any possible damages to the first hemispherical grained silicon layer can be avoided. Hence, leakage current from subsequently deposited dielectric layer above the lower electrode of a capacitor can be prevented.

In another aspect of this invention, the etching back operation of the first hemispherical grained silicon layer can be effectively controlled so that micro-bridge formation between lower electrodes are eliminated.

In yet another aspect of this invention, the removal of the oxide layer can increase the surface area of the lower electrode, thereby increasing the capacitance of the capacitor.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 1A through 1F (Prior Art) are cross-sectional views showing the progression of manufacturing steps in producing the lower electrode of a capacitor according to a conventional method.

DESCRIPTION OF THE PREFERRED EMBODIMENTS

Figure 1A:
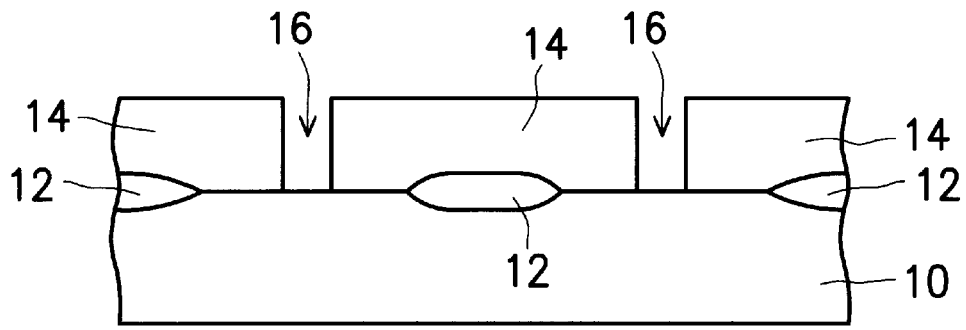
Figure 1B:
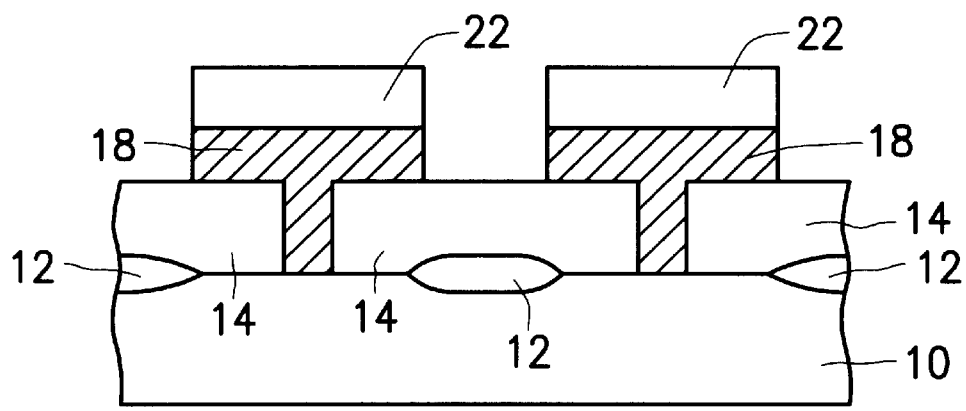
Figure 1C:
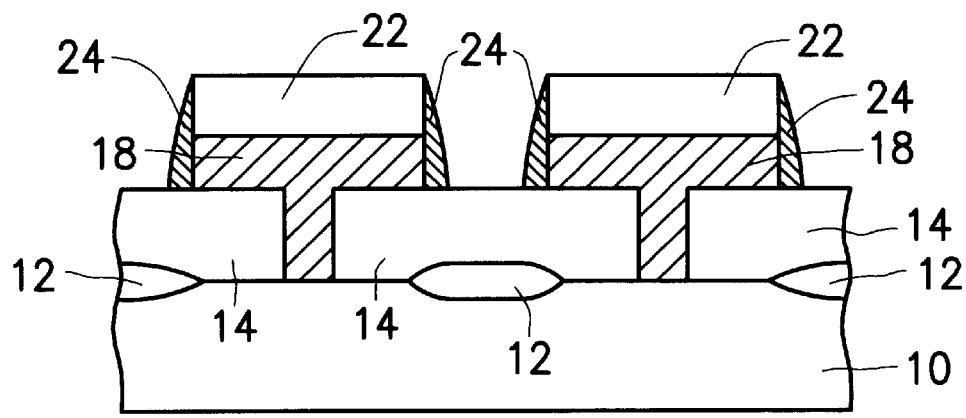
Figure 1D:
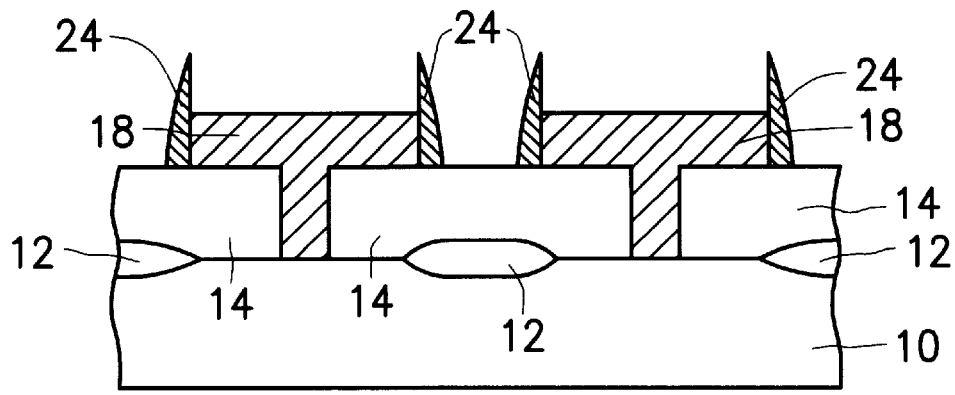
Figure 1E:
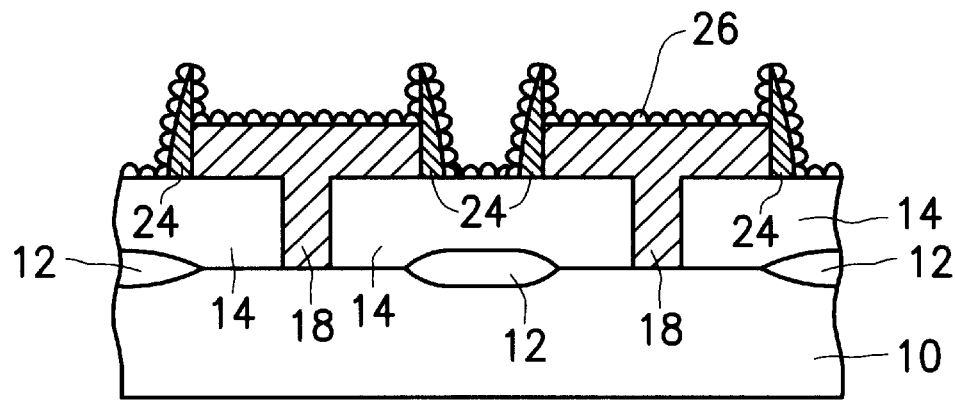
Figure 1F:
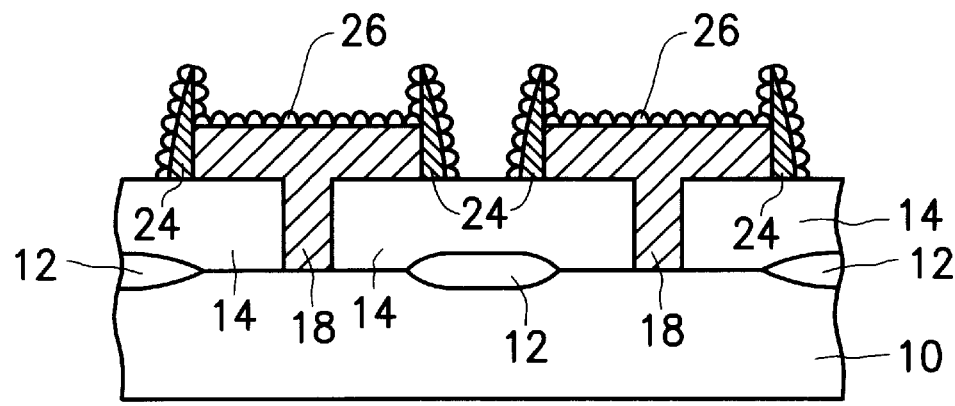

Reference will now be made in detail to the present preferred embodiments of the invention, examples of which are illustrated in the accompanying drawings. Wherever possible, the same reference numbers are used in the drawings and the description to refer to the same or like parts.

Figure 2A:
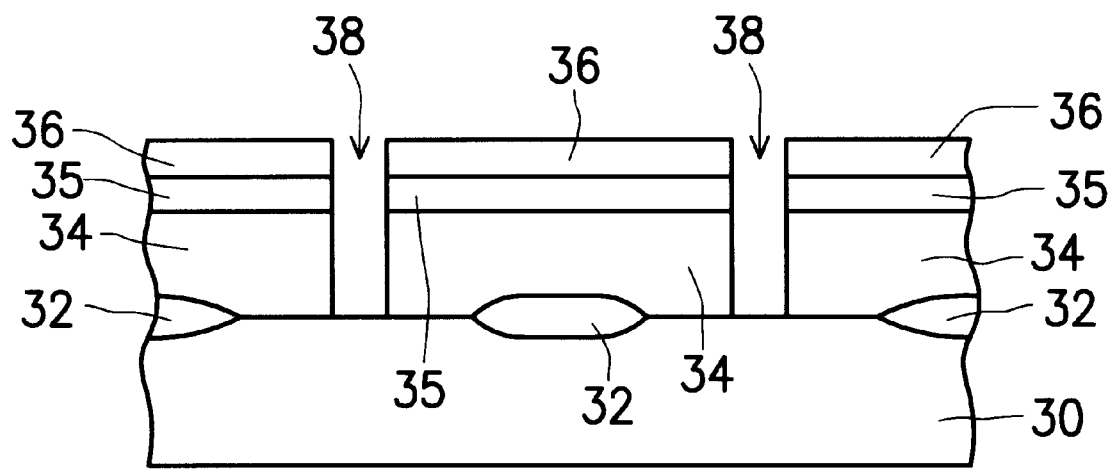
FIGS. 2A through 2D are cross-sectional views showing the progression of manufacturing steps in producing the lower electrode of a capacitor according to one preferred embodiment of this invention.

FIGS. 2A through 2D are cross-sectional views showing the progression of manufacturing steps in producing the lower electrode of a capacitor according to one preferred embodiment of this invention. First, as shown in FIG. 2A, a semiconductor substrate 30 having field oxide layers 32 defining a device region is provided. Details of the devices within the device region are not shown in the figure. Next, a dielectric layer 34, for example, a silicon oxide layer, is formed over the whole substrate structure, and then a silicon nitride layer 35 is deposited over the dielectric layer 34. Thereafter, an oxide layer 36 is formed over the silicon nitride layer 35. The oxide layer 36 can be made, for example, from borophosphosilicate glass (BPSG). In the subsequent step, photolithographic and etching processes are used to pattern the oxide layer 36, the silicon nitride layer and the dielectric layer 34. Consequently, contact openings 38 that expose a source/drain region of a transistor within the device region (not shown in the figure) are formed.

Figure 2B:
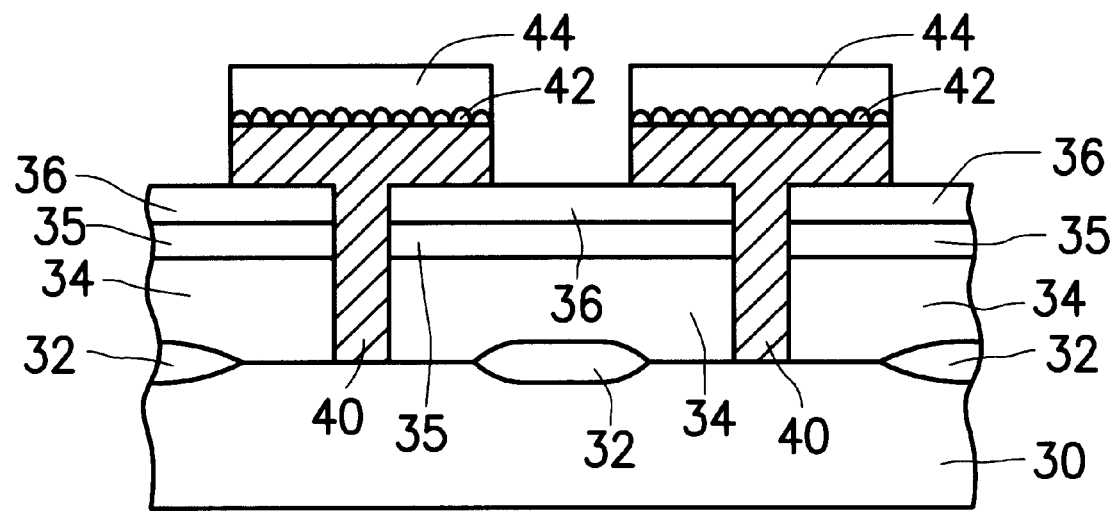

Next, as shown in FIG. 2B, a conductive layer 40 is deposited over the oxide layer 36 and into the contact openings 38 making electrical connection with the source/drain region of the transistor. The conductive layer 40 can be an ion-doped polysilicon layer formed using, for example, a low-pressure chemical vapor deposition (LPCVD) method. Thereafter, a hemispherical grained silicon layer 42 is formed over the conductive layer 40. The hemispherical grained silicon layer 42 can be deposited, for example, by a low pressure vapor deposition (LPCVD) method using a silane $SiH_4$ or $Si_2H_6$ as the source of reactive gas. The deposition of hemispherical grained silicon is preferably conducted at a temperature between the growth of amorphous silicon and the growth of polysilicon. Next, a cap dielectric layer 44, for example, a borophosphosilicate glass layer, is deposited over the hemispherical grained silicon layer 42 using a chemical vapor deposition method, for example. Subsequently, photolithographic and etching processes are used to pattern the cap dielectric 44, the hemispherical grained silicon layer 42 and the conductive layer 40 exposing a portion of the oxide layer 36. Finally, a structure as shown in FIG. 2B is obtained.

Figure 2C:
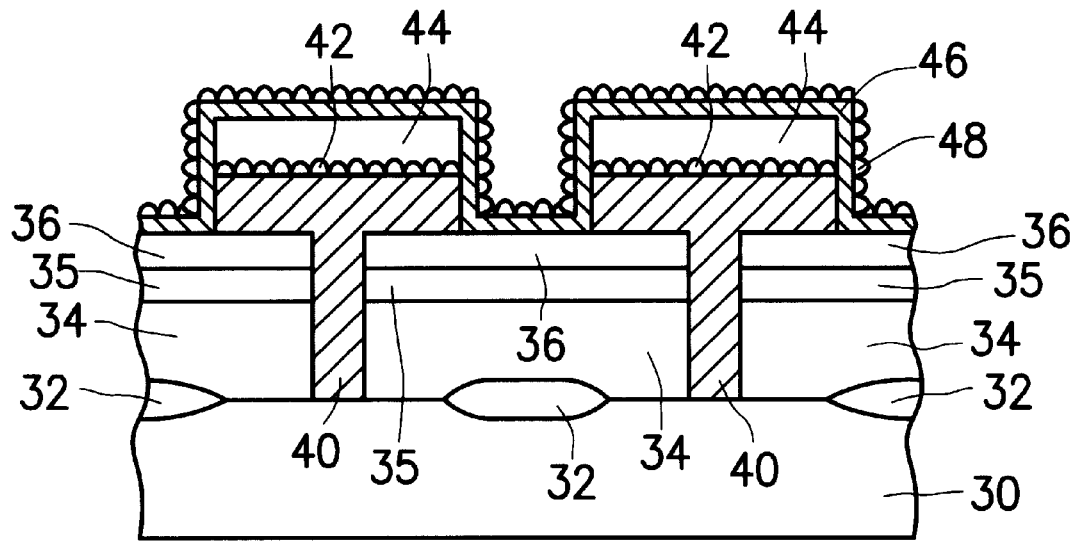

Next, as shown in FIG. 2C, a conductive layer 46 made from an ion-doped polysilicon material is deposited over the whole substrate structure including the cap dielectric layer 44 and the oxide layer 36 using, for example, a low-pressure chemical vapor deposition method. Thereafter, another hemispherical grained silicon layer 48 is formed over the conductive layer 46 using the same method as in forming the hemispherical grained silicon layer 42.

Figure 2D:
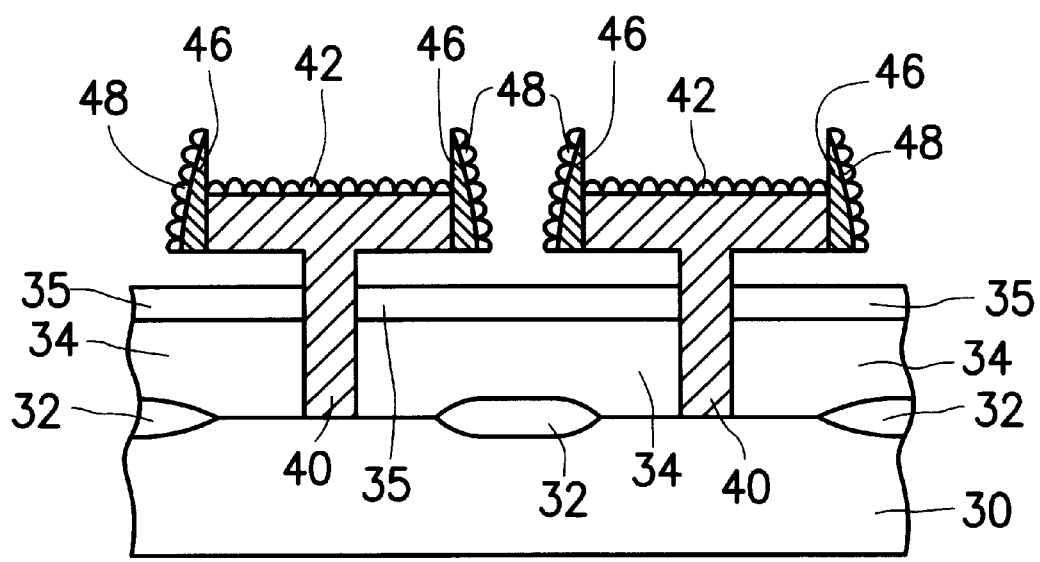

Next, as shown in FIG. 2D, the hemispherical grained silicon layer 48 and the conductive layer 46 are etched back using, for example, an anisotropic etching method. After the etching back operation, the conductive layer 46 will turn into a spacer structure over the sidewalls of the dielectric layer 44 and the conductive layer 40, and exposing a portion of the oxide layer 36. Since an anisotropic etching back operation is employed, portions of the hemispherical grained silicon layer 48 that forms over the conductive spacers 46 are retained. In the subsequent step, the cap dielectric layer 44 is removed until the hemispherical grained silicon layer 42 is exposed. The cap dielectric layer 44 is removed, for example, by a reactive ion etching (RIE) method employing gaseous hydrogen fluoride or hydrofluoric acid solution. Since the oxide layer 36 is composed of the same material as the cap dielectric layer 44, the oxide layer 36 will also be removed in the RIE as well. Up to this stage, the lower electrode of a capacitor, which comprises the hemispherical grained silicon layer 42, the hemispherical grained silicon layer 48, the conductive layer 40 and the conductive layer 46, is formed.

This invention uses the cap dielectric layer 44 as a mask for protecting the hemispherical grained silicon layer 42 against etching back operation such that damages to the hemispherical grained silicon layer are minimized. Hence, leakage current from subsequently deposited dielectric layer above the lower electrode of a capacitor can be prevented.

Another aspect of this invention is the effective control of etching the hemispherical grained silicon layer 48 so that micro-bridges between lower electrodes are rarely formed.

A third aspect of this invention is that the removal of the oxide layer can increase the surface area of the lower electrode. Therefore, the capacitance of the capacitor can be increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming the lower electrode of a capacitor comprising:

providing a semiconductor substrate;

forming a first dielectric layer over the substrate;

forming a silicon nitride layer over the first dielectric layer;

forming an oxide layer on the silicon nitride layer;

patterning the oxide layer, the silicon nitride layer and the first dielectric layer to form a contact opening exposing a specified region of semiconductor substrate;

forming a first conductive layer over the oxide layer that also fills the contact opening making electrical connection with the specified region in the substrate;

forming a first hemispherical grained silicon layer over the first conductive layer;

forming a second dielectric layer over the first hemispherical grained silicon layer;

patterning the second dielectric layer, the first hemispherical grained silicon layer and the first conductive layer to expose a portion of the oxide layer;

forming a second conductive layer over the second dielectric layer, the first conductive layer and the oxide layer;

forming a second hemispherical grained silicon layer over the second conductive layer;

removing a portion of the second conductive layer and the second hemispherical grained silicon layer that lies above the oxide layer and the second dielectric layer to expose the oxide layer and the second dielectric layer, and resulting in a portion of the second conductive layer and the second hemispherical grained silicon layer that remains attached to the sidewalls of the second dielectric layer and the first conductive layer; and removing the second dielectric layer, wherein the oxide layer is also removed.

2. The method of claim 1, wherein the step of forming the first conductive layer includes a low-pressure chemical vapor deposition method.

3. The method of claim 1, wherein the step of forming the second conductive layer includes a low-pressure chemical vapor deposition method.

4. The method of claim 1, wherein the step of forming the first hemispherical grained silicon layer includes a low-pressure chemical vapor deposition method.

5. The method of claim 1, wherein the step of forming the second hemispherical grained silicon layer includes a low-pressure chemical vapor deposition method.

6. The method of claim 1, wherein each of the step of removing the oxide layer, the step of removing the second conductive layer, and the step of removing the second hemispherical grained silicon layer includes an anisotropic etching process.

7. The method of claim 1, wherein the step of removing the second dielectric layer includes using hydrofluoric acid solution.

8. The method of claim 1, wherein the step of removing the second dielectric layer includes using gaseous hydrogen fluoride.

9. The method of claim 1, wherein the step of removing the second dielectric layer includes using a reactive ion etching method.

10. The method of claim 1, wherein the specified region is a source/drain region of a transistor.

11. The method of claim 1, wherein the step of forming the first conductive layer includes depositing ion-doped polysilicon.

12. The method of claim 1, wherein the step of forming the second conductive layer includes depositing ion-doped polysilicon.

13. The method of claim 1, wherein the step of forming the first dielectric layer includes depositing silicon oxide.

14. The method of claim 1, wherein the step of forming the second dielectric layer includes depositing borophosphosilicate glass.

15. The method of claim 1, wherein the step of forming the oxide layer includes depositing borophosphosilicate glass.

* * * * *